(12) United States Patent
Serpinet et al.

(10) Patent No.: US 7,821,253 B2
(45) Date of Patent: Oct. 26, 2010

(54) DIRECT CURRENT MEASURING DEVICE HAVING MAGNETIC SENSORS FOR CURRENT GENERATED MAGNETIC FIELDS

(75) Inventors: Marc Serpinet, Montchaboud (FR); Francois Vincent, La Buisse (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 12/086,602

(22) PCT Filed: Jan. 11, 2007

(86) PCT No.: PCT/FR2007/000045
§ 371 (c)(1),
(2), (4) Date: Feb. 19, 2009

(87) PCT Pub. No.: WO2007/085711
PCT Pub. Date: Aug. 2, 2007

(65) Prior Publication Data
US 2010/0001716 A1 Jan. 7, 2010

(30) Foreign Application Priority Data
Jan. 24, 2006 (FR) .................................. 06 00658

(51) Int. Cl.
*G01R 15/18* (2006.01)
(52) U.S. Cl. ................................. 324/117 R
(58) Field of Classification Search .................. None
See application file for complete search history.

(56) References Cited

U.S. PATENT DOCUMENTS

| | | | | |
|---|---|---|---|---|
| 3,323,057 | A * | 5/1967 | Haley | 324/117 R |
| 4,518,918 | A | 5/1985 | Avery | 324/208 |
| 4,625,166 | A | 11/1986 | Steingroever et al. | |
| 6,605,936 | B1 | 8/2003 | Tamai et al. | 324/117 R |
| 6,836,137 | B2 | 12/2004 | Hartmann | 324/765 |
| 7,164,263 | B2 * | 1/2007 | Yakymyshyn et al. | 324/117 R |
| 7,355,381 | B2 * | 4/2008 | Noel | 324/117 R |
| 2002/0145416 | A1 * | 10/2002 | Attarian et al. | 324/127 |
| 2004/0027891 | A1 | 2/2004 | Hartmann | 365/202 |

FOREIGN PATENT DOCUMENTS

| | | |
|---|---|---|
| DE | 101 08 640 A1 | 9/2002 |
| DE | 102 40 242 A1 | 3/2004 |
| EP | 1 030 183 A1 | 8/2000 |

* cited by examiner

*Primary Examiner*—Vinh P Nguyen
(74) *Attorney, Agent, or Firm*—Steptoe & Johnson LLP

(57) ABSTRACT

A direct current measuring device having at least one first magnetic sensor and at least one second magnetic sensor sensitive to a magnetic field generated by an electric current flowing in a conductor. The measuring device includes a processing unit connected to the magnetic sensors and generates an output signal dependent on measurement signals supplied by the magnetic sensors. The processing unit includes selection means supplying the output signal and is dependent, for weak electric currents, on the first measurement signals from a first magnetic sensor, and is dependent, for strong electric currents, on the second measurement signals from a second magnetic sensor.

12 Claims, 4 Drawing Sheets

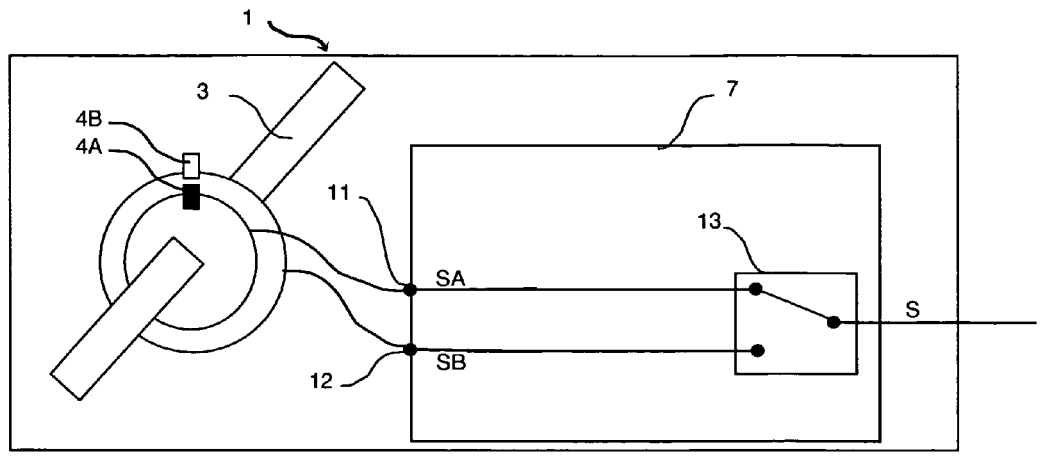
Fig. 1
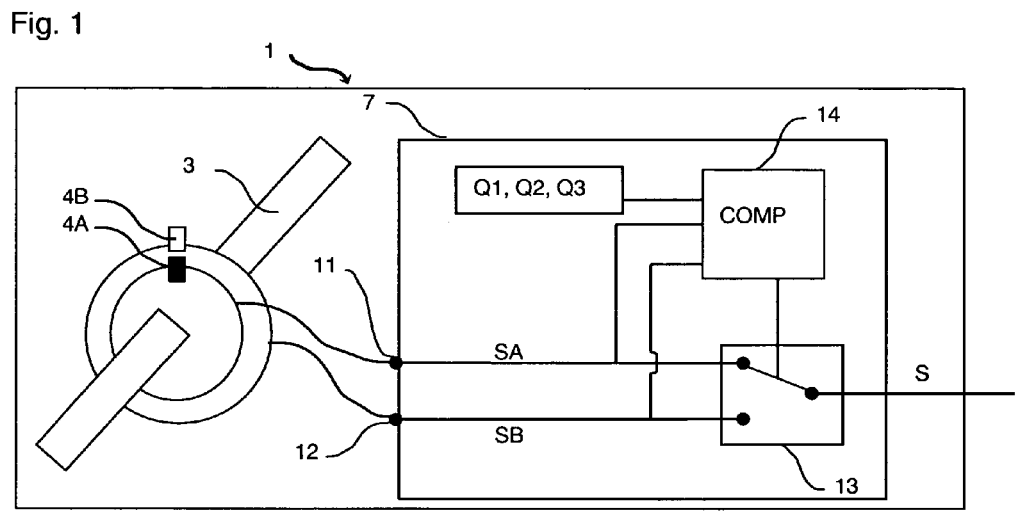
Fig. 2
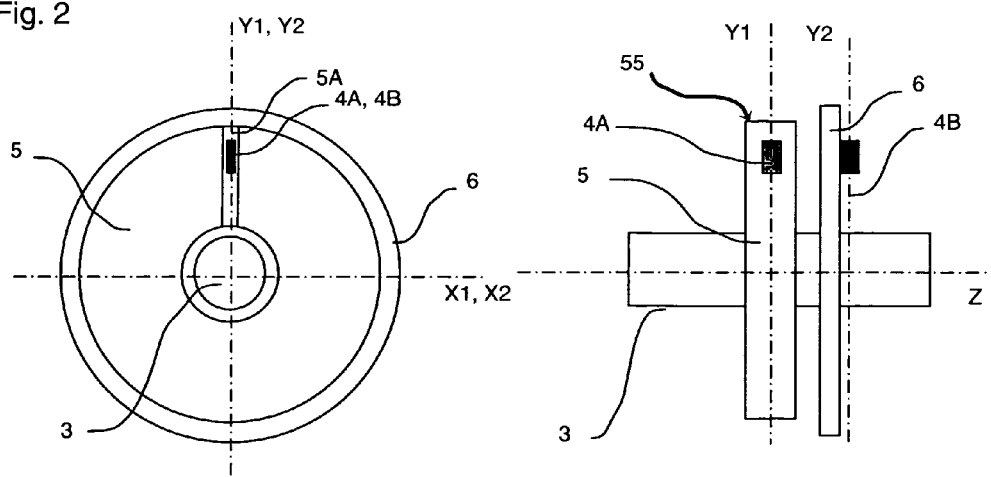
Fig. 3
Fig. 4

DIRECT CURRENT MEASURING DEVICE HAVING MAGNETIC SENSORS FOR CURRENT GENERATED MAGNETIC FIELDS

The present application is based on International Application PCT/FR2007/000045 filed Jan. 11, 2007, which claims priority of French Patent Application No. 0600658, filed Jan. 24, 2006, the entire contents of which are hereby incorporated by reference.

BACKGROUND OF THE INVENTION

The invention relates to a direct current measuring device comprising at least one first magnetic sensor and at least one second magnetic sensor, said magnetic sensors being sensitive to a magnetic field generated by an electric current flowing in a conductor. The current measuring device comprises a processing unit connected to the magnetic sensors and designed to generate an output signal dependent on the measurement signals supplied by the magnetic sensors and representative of said electric current flowing in the conductor.

The invention also relates to an electro-technical unit comprising a conversion card connected to trip means designed to send tripping orders. Finally the invention also relates to a switchgear unit comprising an opening mechanism for opening electric contacts and a control relay connected to an electro-technical unit according to the invention.

STATE OF THE ART

The use of direct current measuring devices is extremely widespread in particular for naval or nautical applications.

As described in the patents U.S. Pat. No. 4,625,166 and EP1030183, direct current measuring devices use magnetic sensors. These magnetic sensors are generally Hall effect sensors or magnetoresistors. The magnetic sensors are arranged geometrically around a conductor in which an electric current flows. The magnetic sensors are sensitive to the magnetic field induced by the electric current flowing in the conductor. The sensors detect a magnetic field proportional to the intensity of the electric current and emit an electric signal proportional to the current flowing through the sensor.

The magnetic sensors are generally associated with processing means. Said processing means provide information representative of the value of the electric current flowing in the conductor. Furthermore, the processing means can previously affect a weighting coefficient of the signals emitted by each of the magnetic sensors. The weighting coefficient can in particular be dependent on the relative position of each magnetic sensor with respect to the conductor. The processing means can also establish the sum of the signals emitted by all the magnetic sensors.

Hall effect sensors can be integrated in a magnetic structure placed around a conductor in which a direct electric current flows. The electric current induces a magnetic field and circulation of a magnetic flux is observed in the structure magnetic. The Hall effect sensors having the flux magnetic flowing through them then produce a signal representative of the magnetic field observed from their position with respect to the conductor.

Arrangement of the magnetic sensors with the magnetic structure generally enables a good sensitivity to be observed for weak electric currents. The structure magnetic is generally made of ferromagnetic material presenting a high magnetic permeability. On account of the high magnetic permeability of said magnetic structure, magnetic fluxes of low intensity can flow therein. The intensity of the signal emitted by the magnetic sensors then varies linearly according to the intensity of the electric current flowing in the conductor. The variation of the intensity follows the profile of a straight line the directing coefficient of which is dependent on the coefficient of permeability. The higher the coefficient of permeability, the greater the directing coefficient of the line.

However, when the electric currents exceed a certain intensity, the response of the measuring device no longer follows the previous linear response curve. Following saturation phenomena observed in particular in the magnetic structure and/or in the magnetic sensor and/or in the measuring channel, the measuring device response becomes erroneous. For example, above a maximum induced flux, a ferromagnetic structure can begin to saturate.

Flow of strong currents electric, in particular short-circuit currents, therefore saturate the measuring device. The signals respectively sent by the magnetic sensors are no longer proportional to the current intensity flowing in the conductor and the signal supplied by the measuring device is erroneous. High-intensity electric currents cannot be measured with this type of measuring device. It should be noted that the greater the permeability of a material, the more quickly the saturation level is reached.

The problems relating to saturation or heating of the magnetic structure are solved in the state-of-the-art document EP1030183. The Hall effect sensors are in fact arranged on a non-magnetic structure. However, this type of solution presents the drawback of not being sufficiently sensitive to low-intensity electric currents. In this type of sensor, the magnetic field measured by the magnetic sensors is weak, for said sensors do not comprise a magnetic circuit.

SUMMARY OF THE INVENTION

The object of the invention is therefore to remedy the shortcomings of the state of the art so as to propose a sensitive direct current measuring device providing a wide measuring range.

The processing unit of the current measuring device according to the invention comprises a first input receiving first measurement signals from at least one first magnetic sensor integrated in a first profile made of ferromagnetic material with high magnetic permeability and which is designed to surround the electric conductor, a second input receiving second measurement signals from at least one second magnetic sensor arranged on at least one section with low magnetic permeability to form a second profile designed to surround the electric conductor, selection means providing the output signal dependent on the first measurement signals for weak electric currents, and dependent on the second measurement signals for strong electric currents.

According to a mode of development of the invention, the processing unit comprises comparison means comparing at least one first measurement signal with a first setpoint, the output signal being dependent on the first measurement signals, if the first measurement signals are lower than said first setpoint.

According to a mode of development of the invention, the processing unit comprises comparison means comparing at least one second measurement signal with a second setpoint, the output signal being dependent on the first measurement signals if the second measurement signals are lower than said second setpoint.

According to a mode of development of the invention, the processing unit comprises comparison means comparing a ratio between the first measurement signal and the second measurement signal with a third setpoint, the output signal being dependent on the first measurement signals if said ratio is greater than or equal to said third setpoint, the third setpoint being equal to a theoretical ratio between the first and second measurement signals and for weak electric currents Advantageously, the first setpoint is lower than the saturation threshold, a first electric current giving rise to a first measurement signal equal to the first setpoint is lower than the value of a saturation current.

In a particular embodiment, the measuring device comprises at least three first magnetic sensors connected to one another by first sections of made ferromagnetic material of high magnetic permeability to form a first magnetic profile, at least three second magnetic sensors arranged on at least one second section of low magnetic permeability to form a second magnetic profile, summing means making a first sum of the first measurement signals and a second sum of the second measurement signals.

The output signal is dependent on the first measurement signals if the first sum of the first measurement signals is less than a fourth setpoint.

The output signal is dependent on the first measurement signals if the second sum of the second measurement signals is less than a fifth setpoint.

The output signal is dependent on the first measurement signals if the ratio measured between the first sum and the second sum is greater than or equal to a sixth setpoint, the sixth setpoint being equal to a theoretical ratio between the first and second sums of the first and second measurement signals for weak electric currents.

Advantageously, the first magnetic sensors are arranged in a first plane at equal distance from the central axis of the conductor and the second magnetic sensors are arranged in a second plane at equal distance from the central axis of the conductor The first magnetic sensors are preferably composed of three Hall effect sensors arranged 120° from one another around the central axis and the second magnetic sensors are preferably composed of three Hall effect sensors arranged 120° from one another around the central axis.

Advantageously, the second and first magnetic sensors are placed at equal distance from the central axis of the conductor.

An electro-technical unit comprises a conversion card connected to trip means designed to send tripping orders. The conversion card is designed to transform the output signal coming from processing means of the measuring device as defined above and to provide an AC control signal to the trip means.

A switchgear unit comprises an opening mechanism for opening electric contacts and a control relay connected to an electro-technical unit as defined above. The control relay receives tripping orders from the electronic trip unit and/or from an electromagnetic trip unit.

Advantageously, the electromagnetic trip unit comprises a magnetic circuit surrounding an electric line or conductor forming the primary circuit of a transformer, a secondary winding coiled on a part of the magnetic circuit being directly connected to the control relay.

BRIEF DESCRIPTION OF THE DRAWINGS

Other advantages and features will become more clearly apparent from the following description of particular embodiments of the invention given as non-restrictive examples only and represented in the accompanying drawings, in which:

FIG. 1 represents a schematic view of a direct current measuring device according to a first embodiment of the invention;

FIG. 2 represents a schematic view of a direct current measuring device according to a second embodiment of the invention;

FIGS. 3 and 4 represent schematic views of the arrangement of the magnetic sensors of the direct current measuring devices according to FIGS. 1 and 2;

DETAILED DESCRIPTION OF AN EMBODIMENT

Figure 5:
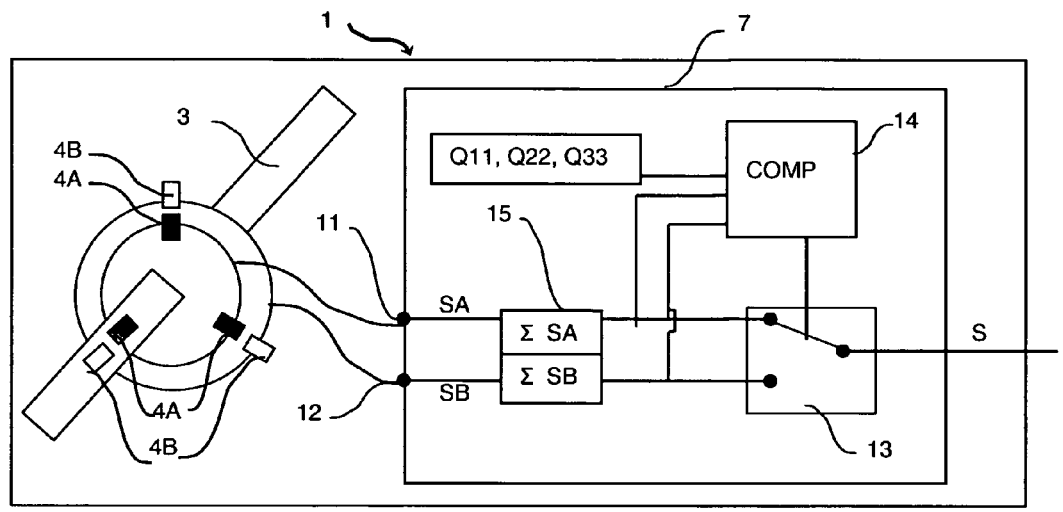
FIG. 5 represents a schematic view of a direct current measuring device according to a third embodiment of the current measuring device.

According to a first embodiment of the invention, the direct current measuring device 1 comprises magnetic sensors 4A, 4B sensitive to a magnetic field generated by an electric current I flowing in a conductor 3. These magnetic sensors are preferably Hall effect sensors. It can however be envisaged to use magnetoresistors.

As represented in FIGS. 3 and 4, these magnetic sensors are arranged on two profiles 55, 6.

At least one first magnetic sensor 4A is integrated in a first magnetic profile 55 designed to surround an electric conductor 3. The first magnetic profile comprises at least one elongate section 5 made from ferromagnetic material with high magnetic permeability. The section is configured such that these two ends are placed facing one another. A space is present between these two ends. This space forms an air-gap 5A in which a magnetic sensor 4A is placed. According to this example of embodiment, the first magnetic sensor 4A is arranged in a first plane X1Y1. The first magnetic sensor 4A is sensitive to the magnetic field created by the flow of electric current I flowing in conductor 3. Said sensor is designed to provide a first DC measurement signal SA representative of the magnetic field. The rms value of first measurement signal SA depends on the magnetic field received by first magnetic sensor 4A. As the magnetic field is dependent on the DC electric current flowing in conductor 3, said rms value is therefore proportional to said direct current.

At least one second magnetic sensor 4B is arranged on at least one section 6 with a low magnetic permeability. This section 6 essentially acts as mechanical support of the second sensor or sensors 4B and forms a second profile designed to surround electric conductor 3. According to this embodiment example, it can be considered that section 6 has a magnetic permeability substantially equal to that of air. According to this embodiment of the invention, second magnetic sensor 4B is arranged in a second plane X2Y2. Second magnetic sensor 4B is sensitive to the magnetic field created by the flow of electric current I in conductor 3. Said sensor is designed to provide a second measurement signal SB representative of the magnetic field. The rms value of second measurement signal SB depends on the magnetic field received by the sensor. As the magnetic field is dependent on the DC electric current flowing in conductor 3, said rms value is therefore proportional to said direct current.

According to this embodiment, first and second magnetic sensors 4A, 4B are placed at equal distance from the central axis Z of conductor 3. The first and second planes X1Y1 and X2Y2 are offset along the axis Z.

Figure 8:
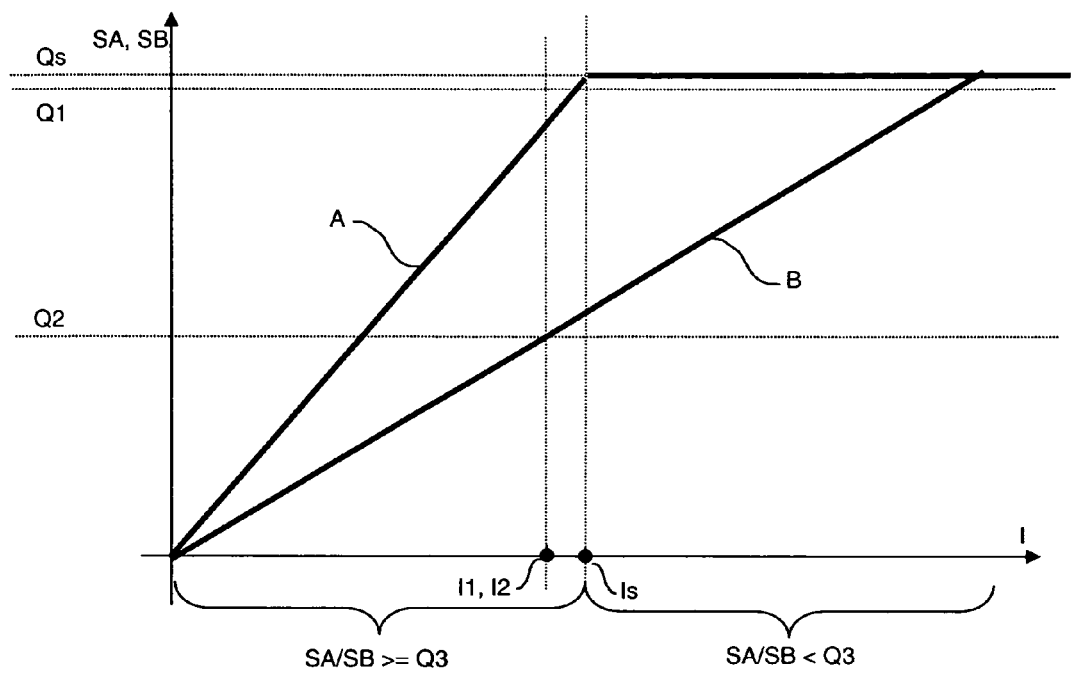
FIG. 8 represents two plots of signals emitted by magnetic sensors according to FIGS. 1 and 2.

FIG. 8 represents a first and second plot A and B of first and second measurement signals SA and SB respectively emitted by first and second magnetic sensors 4A, 4B. First magnetic profile 55 used in this type of measuring device 1 comprises a saturation threshold Qs. The saturation threshold Qs is both dependent on the physical and geometric characteristics of first magnetic profile 55 and on an electric current Is called saturation current. The saturation current Is corresponds to the electric current above which first measurement signal SA emitted by first magnetic sensor 4A no longer follows a linear response curve. The shape and cross-section of section or sections 5 and the nature of the materials used to manufacture said sections 5 enable the magnetic permeability of first magnetic profile 55 to be determined.

As represented in FIGS. 1 and 2, measuring device 1 comprises a processing unit 7 respectively connected to magnetic sensors 4A, 4B by a first and second input 11, 12. Processing unit 7 is designed to generate an output signal S representative of the electric current I flowing in conductor 3.

After receiving respectively first and second measurement signals SA and SB from first and second magnetic sensors 4A, 4B, selection means 13 of processing unit 7 generate output signal S which is dependent both on the value of first measurement signal SA for weak electric currents I and on the value of second measurement signal SB for strong electric currents I.

According to this embodiment of the invention, the electric currents I are considered as being weak when their values are lower than that of saturation current Is saturating first magnetic profile 55. Moreover, for this type of current measuring device, the electric currents are considered to be strong when their values are greater than that of saturation current Is saturating first magnetic profile 55.

Due to the high magnetic permeability of first magnetic profile 55, amplification and a good distribution of the flux magnetic is observed in the Hall effect sensor. The magnetic flux induced by low-intensity electric currents can then be detected by first magnetic sensor 4A. The sensitivity of first magnetic sensor 4A is therefore sufficient for weak electric currents.

In the presence of high-intensity electric currents I, first measurement signal SA emitted by first sensor 4A is no longer usable. First magnetic profile 55 and/or first magnetic sensor 4A and/or processing unit 7 are in fact saturated and first measurement signal SA is then no longer proportional to electric current I flowing in conductor 3.

As represented in FIG. 8, second magnetic profile formed by section 6 of low magnetic permeability and second magnetic sensor 4B is not yet subjected to saturation phenomena due to the presence of strong electric currents. Second magnetic sensor 4B can therefore still supply a second measurement signal SB directly proportional to the electric currents whatever their intensity.

Thanks to the combination of information provided by first and second magnetic sensors 4A, 4B, measuring device 1 thus presents a wide measuring range while at the same time keeping a good sensitivity for measuring low-intensity electric current.

According to a development of the invention represented in FIG. 2, processing unit 7 of direct current measuring device 1 comprises comparison means 14. These comparison means 14 compare at least one of measurement signals SA, SB with at least one setpoint Q1, Q2, Q3.

The output signal S is dependent on first measurement signal SA if first measurement signal SA is lower than a first setpoint Q1 and/or if second measurement signal SB is lower than a second setpoint Q2.

Figure 9:
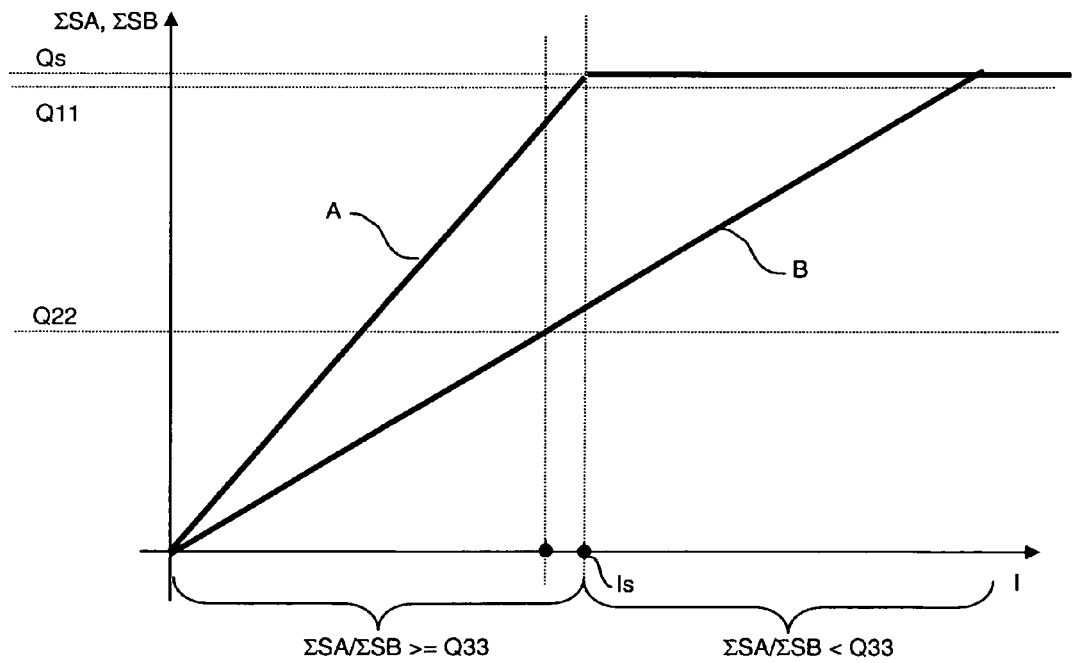
FIG. 9 represents two plots of signals emitted by magnetic sensors according to FIG. 5.
Figure 10:
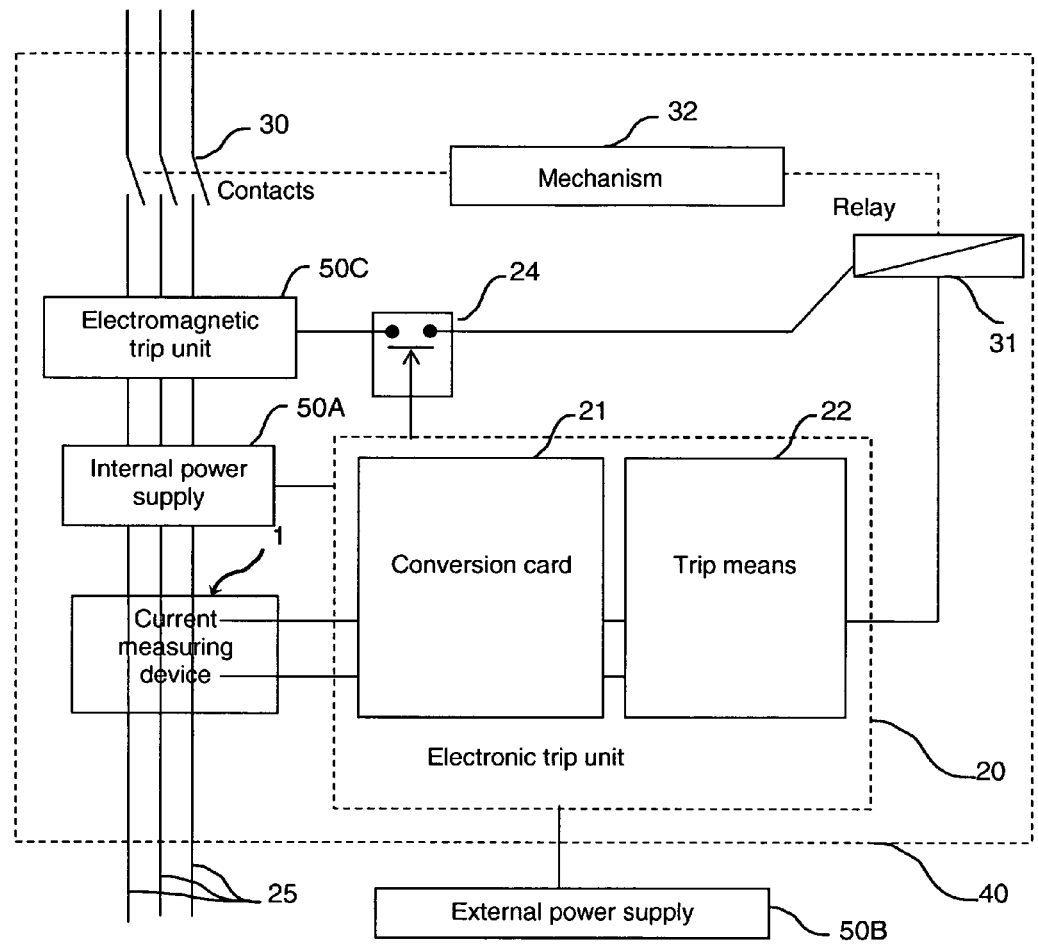
FIG. 10 represents a general block diagram of a switchgear unit according to an embodiment of the invention.

According to this development, first setpoint Q1 is lower than saturation threshold Qs. In other words, a first electric current I1 giving rise to a first measurement signal SA equal to first setpoint Q1 is lower than saturation current Is. Furthermore, as represented in FIG. 9, an electric current I2 giving rise to a second measurement signal SB equal to second setpoint Q2 is preferably equal to first current I1.

Furthermore, comparison means 14 make a comparison between first and second measurement signals SA, SB and a third setpoint Q3. For weak electric currents I, third setpoint Q3 is equal to a theoretical ratio between first measurement signal SA and second measurement signal SB. Output signal S is dependent on first measurement signal SA, if the ratio SA/SB measured between first measurement signal SA and second measurement signal SB is greater than or equal to third setpoint Q3.

The method for measuring an electric current I with a measuring device 1 according to the preferred embodiments is as follows.

First and second measurement signals SA and SB are respectively compared with first and second setpoints Q1 and Q2. In addition, the ratio SA/SB between first measurement signal SA and second measurement signal SB is compared with third setpoint Q3. Selection means 13 generate an output signal S representative of the electric current flowing in conductor 3.

Said output signal is dependent on first measurement signal SA when:
 first measurement signal SA is lower than a first setpoint Q1 and/or
 second measurement signal SB is lower than a second setpoint Q2, and/or
 the ratio SA/SB between first measurement signal SA and second measurement signal SB is greater than or equal to third setpoint Q3. Said ratio SA/SB is substantially constant for electric current values lower than saturation current Is.

Said output signal S is dependent on second measurement signal SB when:
 first measurement signal SA is higher than a first setpoint Q1
 and/or
 second measurement signal SB is higher than a second setpoint Q2.
 and/or
 the ratio SA/SB between first measurement signal SA and second measurement signal SB is lower than third setpoint O3. Said ratio SA/SB tends to decrease for electric current values higher than saturation current Is.

Figure 6:
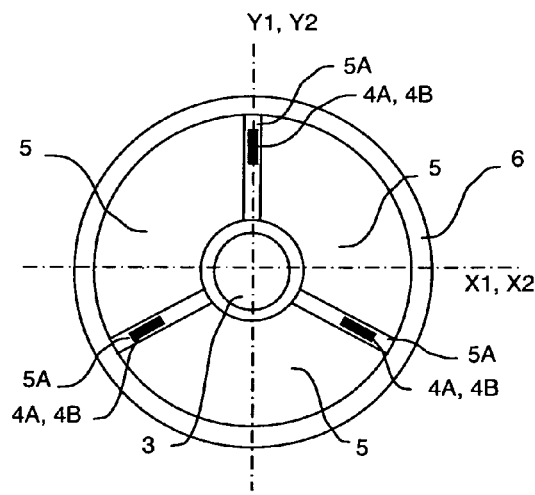
FIGS. 6 and 7 represent schematic views of the arrangement of the magnetic sensors of the alternative embodiment according to FIG. 6.
Figure 7:
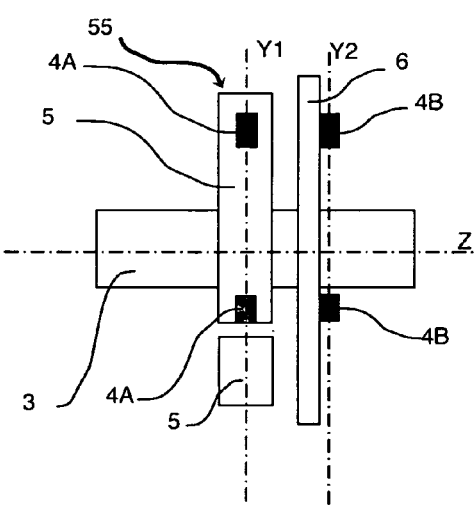

According to another embodiment of the invention, the measuring device comprises at least three first magnetic sensors 4A and at least three second magnetic sensors 4B. As represented in FIGS. 6 and 7, the first and second magnetic sensors are arranged in two groups. According to this embodiment, three first magnetic sensors 4A are connected to one another by first sections 5. These first sections 5 are made of ferromagnetic material with a high magnetic permeability. Each first magnetic sensor 4A is placed in an air-gap 5A present between two sections 5. The set of first sections 5 and first magnetic sensors 4A forms first magnetic profile 55 designed to surround an electric conductor 3. The first magnetic sensors 4A are arranged in a first plane X1Y1 at equal distance from the central axis Z of conductor 3. The first magnetic sensors 4A observe a regular angular distribution around said axis Z. They are preferably composed of three Hall effect sensors arranged 120° from one another around the axis Z. By making a vector sum of first measurement signals SA provided by the group of first magnetic sensors 4A, this specific arrangement of the three first magnetic sensors 4A enables sensitivity to external or neighbouring magnetic fields to be avoided.

Three second magnetic sensors 4B are arranged on at least one second section 6 with low magnetic permeability and acting as mechanical support. It can be considered that section 6 has a magnetic permeability substantially equal to that of air. The assembly formed by section 6 and second magnetic sensors 4B forms a second magnetic profile designed to surround an electric conductor 3. According to this alternative embodiment of the invention, second magnetic sensors 4B are arranged in a second plane X2Y2 at equal distance from the central axis Z of conductor 3. Furthermore, second magnetic sensors 4B observe a regular angular distribution around the axis Z. They are preferably composed of three Hall effect sensors arranged 120° from one another around the axis Z. By making a vector sum of the second measurement signals SB provided by the group of three second magnetic sensors 4B, this specific arrangement of the three second magnetic sensors 4B enables sensitivity to external or neighbouring magnetic fields to be avoided.

As represented in FIG. 5, processing unit 7 of current measuring device 1 preferably comprises summing means 15. Said means make a first sum $\Sigma SA$ of first measurement signals SA from first magnetic sensors 4A and a second sum $\Sigma SB$ of second measurement signals SB from second magnetic sensors 4B.

According to this embodiment, comparison means 14 of processing unit 7 can make a comparison of a fourth setpoint Q11 with the first sum $\Sigma SA$ of first signals SA and a comparison of a fifth setpoint Q22 with the second sum $\Sigma SB$ of second signals SB. Moreover, processing unit 7 can make a comparison of a sixth setpoint Q33 with the ratio $\Sigma SA/\Sigma SB$ between the first sum $\Sigma SA$ of first measurement signals SA and the second sum $\Sigma SB$ of second measurement signals SB.

According to a first alternative embodiment, air-gap 5A in which each magnetic sensor 4A is placed comprises a magnetic shunt.

According to a second alternative embodiment, the Hall effect sensors of first and second magnetic sensors 4A, 4B are programmable. The gain of each Hall effect sensor can thus be adjusted according to the rating of measuring device 1. A first weighting coefficient can be applied to each measurement signal SA, SB emitted by each magnetic sensor. The same measuring device can therefore be used for different measurement ratings.

According to another alternative embodiment, the second and first magnetic sensors 4A, 4B are placed at different distances from the central axis Z of conductor 3.

A second weighting coefficient can enable measurement errors due to incorrect positioning of each magnetic sensor with respect to conductor 3 to be corrected. Indeed, before use, each measuring device 1 can be calibrated under actual operating conditions. On account of the geometric distribution and the distance separating each sensor from the conductor, all the sensors should theoretically provide the same signal. However, due to the slight incorrections that may occur in centring and orientation of the conductor with respect to the sensors, and due to possible disturbances due to the environment, measurement signal intensity variations of each sensor are observed. The second weighting coefficient then enables these disparities to be compensated so as to equal out the measurement signals supplied by the sensors.

Current measuring device 1 according to the different embodiments of the invention is particularly designed to be combined with an electronic conversion card 21.

Conversion card 21 is contained in an electronic trip unit 20 designed to command opening of a switchgear unit such as a circuit breaker 40. Conversion card 21 is connected to trip means 22 of electronic trip unit 20.

Conversion card 21 is designed to transform the DC output signal S from processing means 7 of measuring device 1 and to supply an AC command signal to trip means 22 of electric trip unit 20.

The DC rms value of the field proportional to the direct current sent by processing means 7 of measuring device 1 is transformed into a 50 Hz AC signal with the same rms value.

The choice of long-delay or short-delay measuring range is made by this conversion card 21 according to the linearity of the signals. Conversion card 21 is identical whatever the rating of circuit breaker 40.

The present electronic trip unit 20 is particularly intended for electric circuit breakers. If electronic trip unit 20 receives information of a fault present on at least one of the electric conductors or lines 25 from current measuring device 1, a command order of contacts 30 can be sent by trip means 22. Said order is sent to control relay 31 which opens contacts 30 by means of an operating mechanism 32. Said contacts 30 are placed in series with electric lines or conductors 25.

First DC voltage supply means 50A can be connected to electronic trip unit 20. These first DC voltage supply means 50A, preferably internal to the switchgear unit, are connected directly to at least one electric line or conductor 25.

According to a first alternative embodiment, auxiliary second electric power supply means 50B can also be connected to electronic trip unit 20. These second electric power supply means, external to the circuit breaker, are designed to supply electronic trip unit 20 should a malfunction occur on first power supply means 50A, in particular in case of a short-circuit on electric lines 25. In the event of a large short-circuit, the power system voltage can then drop and cause a decrease of the voltage supplied by first DC voltage supply means 50A. Such a decrease may cause malfunctioning of trip means 22 which are no longer able to supply control relay 31 to open circuit breaker 40.

According to a second alternative embodiment, circuit breaker 40 comprises an electromagnetic trip unit 50C performing self-protection when circuit breaker 40 is not supplied via an internal power supply 50A or an auxiliary external power supply 50B. This type of trip unit provides instantaneous protection in the presence of faults due to a short-circuit. According to this alternative embodiment, electromagnetic trip unit 50C comprises a magnetic circuit having a movable part and a fixed part. The magnetic circuit surrounds electric line or conductor 25 forming the primary circuit of a transformer. A secondary winding is coiled on a part of the magnetic circuit. This secondary winding is directly connected to control relay 31.

The movable part has a first open position opening the magnetic circuit with an air-gap of large distance. Moreover, the movable part has a second closed position closing the magnetic circuit with a small or zero air-gap. Said movable part moves from the first open position to the second closed position when a primary current flowing in an electric line or conductor 25 exceeds a preset value.

A large variation of the primary current is accompanied by a large variation of the flux created in the magnetic circuit.

This flux variation induces a secondary current in the secondary winding. The secondary current supplies control relay 31 of circuit breaker 40 to cause opening of contacts 32. Such tripping on a short-circuit only takes place above a high primary current drift value. This type of trip unit is described in the European Patent filed by the applicant under publication number EP0841670. The description of said Patent is quoted here for reference purposes.

Electromagnetic trip unit 50C is preferably disabled in the case of presence of an auxiliary internal voltage or external voltage. A switch 24 controlled by electronic trip unit 20 enables the electric connection between the secondary winding of electromagnetic trip unit 50C and control relay 31 to be interrupted.

The invention claimed is:

1. A direct current measuring device comprising:
   at least one first magnetic sensor and at least one second magnetic sensor, said magnetic sensors being sensitive to a magnetic field generated by an electric current flowing in a conductor,
   a processing unit connected to the magnetic sensors and designed to generate an output signal dependent on the measurement signals supplied by the magnetic sensors and representative of said electric current flowing in the conductor, wherein the processing unit comprises:
      a first input receiving first measurement signals from said at least one first magnetic sensor integrated in a first profile designed to surround the electric conductor and comprising at least one section made from ferromagnetic material with high magnetic permeability,
      a second input receiving second measurement signals from said at least one second magnetic sensor arranged on at least one section with low magnetic permeability to form a second profile designed to surround the electric conductor,
      selection means supplying the output signal dependent on the first measurement signals for weak electric currents, and dependent on the second measurement signals for strong electric currents.

2. The direct current measuring device according to claim 1, wherein the processing unit comprises comparison means comparing at least one first measurement signal with a first setpoint, the output signal being dependent on the first measurement signals if the first measurement signals are lower than said first setpoint.

3. The current measuring device according to claim 2, wherein the first setpoint is lower than the saturation threshold, a first electric current giving rise to a first measurement signal equal to the first setpoint is lower than the value of a saturation current.

4. The direct current measuring device according to claim 1, wherein the processing unit comprises comparison means comparing at least one second measurement signal with a second setpoint, the output signal being dependent on the first measurement signals if the second measurement signals are lower than said second setpoint.

5. The direct current measuring device according to claim 1, wherein the processing unit comprises comparison means comparing a ratio between the first measurement signal and the second measurement signal with a third setpoint, the output signal being dependent on the first measurement signal if said ratio is greater than or equal to the third setpoint, the third setpoint being equal to a theoretical ratio between the first and second measurement signals and for weak electric currents.

6. The current measuring device according to claim 1, comprising:
   at least three first magnetic sensors connected to one another by first sections made of ferromagnetic material of high magnetic permeability to form the first magnetic profile designed to surround the electric conductor,
   at least three second magnetic sensors arranged on said at least one second section of low magnetic permeability designed to surround the electric conductor,
   summing means making a first sum of the first measurement signals and a second sum of the second measurement signals.

7. The current measuring device according to claim 6, wherein the output signal is dependent on the first measurement signals if the first sum of the first measurement signals is lower than a fourth setpoint.

8. The current measuring device according to claim 6, wherein the output signal is dependent on the first measurement signals if the second sum of the second measurement signals is lower than a fifth setpoint.

9. The current measuring device according to claim 6, wherein the output signal is dependent on the first measurement signals if the ratio measured between the first sum and the second sum is greater than or equal to a sixth setpoint, the sixth setpoint being equal to a theoretical ratio between the first and second sums of the first and second measurement signals and for weak electric currents.

10. The current measuring device according to claim 1, wherein the first magnetic sensors are arranged in a first plane at equal distance from the central axis of the conductor and wherein the second magnetic sensors are arranged in a second plane at equal distance from the central axis of the conductor.

11. The current measuring device according to claim 10, wherein the first magnetic sensors are composed of three Hall effect sensors arranged 120° from one another around the central axis and wherein the second magnetic sensors are composed of three Hall effect sensors arranged 120° from one another around the central axis.

12. The current measuring device according to claim 1, wherein the first magnetic sensors and the second magnetic sensors are placed at equal distance from the central axis of the conductor.

* * * * *